(12) United States Patent
Chang et al.

(10) Patent No.: US 10,211,367 B2
(45) Date of Patent: Feb. 19, 2019

(54) LIGHT EMITTING DIODE AND FABRICATION METHOD THEREOF

(71) Applicant: XIAMEN SANAN OPTOELECTRONICS TECHNOLOGY CO., LTD., Xiamen (CN)

(72) Inventors: Chia-hung Chang, Xiamen (CN); Gong Chen, Xiamen (CN); Su-hui Lin, Xiamen (CN); Kang-wei Peng, Xiamen (CN); Sheng-hsien Hsu, Xiamen (CN); Chuan-gui Liu, Xiamen (CN); Xiao-xiong Lin, Xiamen (CN); Yu Zhou, Xiamen (CN); Jing-jing Wei, Xiamen (CN); Jing Huang, Xiamen (CN)

(73) Assignee: XIAMEN SANAN OPTOELECTRONICS TECHNOLOGY CO., LTD., Xiamen (CN)

(*) Notice: Subject to any disclaimer, the term of this patent is extended or adjusted under 35 U.S.C. 154(b) by 0 days.

(21) Appl. No.: 15/607,461

(22) Filed: May 27, 2017

(65) Prior Publication Data

US 2017/0263812 A1 Sep. 14, 2017

Related U.S. Application Data

(63) Continuation of application No. PCT/CN2016/077839, filed on Mar. 30, 2016.

(30) Foreign Application Priority Data

Jun. 17, 2015 (CN) .......................... 2015 1 0335543
Jun. 17, 2015 (CN) .......................... 2015 1 0335626

(51) Int. Cl.
*H01L 33/00* (2010.01)
*H01L 33/02* (2010.01)
(Continued)

(52) U.S. Cl.
CPC ............ *H01L 33/025* (2013.01); *H01L 27/15* (2013.01); *H01L 33/007* (2013.01);
(Continued)

(58) Field of Classification Search
CPC ....... H01L 33/025; H01L 27/15; H01L 33/60; H01L 33/0075; H01L 33/007; H01L 33/10
(Continued)

(56) References Cited

U.S. PATENT DOCUMENTS 7,498,238 B2* 3/2009 Tamura .............. B23K 26/0057
257/E21.237
2011/0204412 A1* 8/2011 Sugano ............... H01L 33/0095
257/103
(Continued)

FOREIGN PATENT DOCUMENTS

CN 102142397 A 8/2011
JP 2014148454 A 8/2014

*Primary Examiner* — Vu A Vu
(74) *Attorney, Agent, or Firm* — Syndoca LLC; Feng Ma

(57) ABSTRACT

An LED fabrication method includes forming release holes by focusing a laser at the substrate back surface, and forming stealth laser-blast areas by focusing a laser inside the substrate on positions corresponding to the release holes; communicating the release holes with the stealth laser-blast areas to release impurities generated during forming of the stealth laser-blast areas from the substrate through the release holes, thereby avoiding low external quantum efficiency resulting from adherence of the released material to the side wall of the stealth laser-blast areas. By focusing on a position with 10 μm~40 μm inward from the substrate back side, adjusting laser energy and frequency to burn holes inside the substrate (Continued)

to penetrate and expose the substrate back surface, thereby effectively removing by-products, and reducing light absorption by such by-products, light extraction from a side wall of the LED can also be improved and light extraction efficiency is enhanced.

20 Claims, 5 Drawing Sheets

(51) Int. Cl.
    *H01L 27/15*     (2006.01)
    *H01L 33/10*     (2010.01)
    *H01L 33/60*     (2010.01)
    *H01L 33/20*     (2010.01)

(52) U.S. Cl.
    CPC ...... *H01L 33/0075* (2013.01); *H01L 33/0095* (2013.01); *H01L 33/10* (2013.01); *H01L 33/60* (2013.01); *H01L 33/20* (2013.01)

(58) Field of Classification Search
    USPC .......................................................... 257/88
    See application file for complete search history.

(56) References Cited

U.S. PATENT DOCUMENTS

| | | |
|---|---|---|
| 2013/0234193 A1 | 9/2013 | Odnoblyudov et al. |
| 2015/0214439 A1* | 7/2015 | Herner ................... H01L 33/46 |
| | | 257/13 |
| 2015/0236192 A1* | 8/2015 | Yoo ..................... H01L 33/0025 |
| | | 257/13 |

\* cited by examiner

LIGHT EMITTING DIODE AND FABRICATION METHOD THEREOF

CROSS-REFERENCE TO RELATED APPLICATIONS

The present application is a continuation of, and claims priority to, PCT/CN2016/077839 filed on Mar. 30, 2016, which claims priority to Chinese Patent Application No. 201510335626.2 filed on Jun. 17, 2015 and Chinese Patent Application No. 201510335543.3 filed on Jun. 17, 2015. The disclosures of these applications are hereby incorporated by reference in their entirety.

BACKGROUND

Light-emitting diode (LED) cutting technology is evolving from diamond tool cutting to laser cutting. In laser cutting, the wavelength is generally 355 nm or 266 nm, sufficient to scribe sapphire substrates and various film layers, such as GaN layers, Bragg reflective layers and metal layers.

Referring to FIG. 1, invisible laser cutting for LED has emerged and developed rapidly in recent years. It can penetrate the sapphire substrate 10 by forming explosion points 11 that are full of energy inside the sapphire substrate 10. With explosion of the explosion points 11, the sapphire substrate is thereby cut apart. Compared with ordinary laser cutting or diamond cutting, the invisible laser cutting reduces the laser burning area at wafer side or the injury area on wafer surface, leading to less light loss of wafer; however, as explosion points 11 form inside the substrate 10, materials at the region of explosion points 11 after laser burning would adhere to the side wall of the explosion points 11, thus blocking light from emitting and influencing external quantum efficiency of the LED.

SUMMARY

To solve the above problems, some embodiments of the present disclosure provide a backside scribing method during LED fabrication and the structure thereof. At first, form a plurality of release holes by focusing a laser at the substrate back surface, and form a plurality of stealth laser-blast areas corresponding to the positions of the release holes via invisible laser cutting technology to release impurities generated during invisible laser cutting from the substrate through the release holes. This reduces impact on luminance from adherence of burning impurities to the side wall of the stealth laser-blast areas and improves external quantum efficiency of the LED.

Technical approaches of various embodiments of the present disclosure to solve the above problems can include: a backside scribing method during LED fabrication is provided, comprising: 1) providing a substrate, on which, grow an epitaxial layer and fabricate a plurality of LED units; 2) forming a plurality of release holes by focusing a laser at the substrate back surface; 3) forming stealth laser-blast areas by focusing a laser inside the substrate on the positions corresponding to the release holes; communicate the release holes with the stealth laser-blast areas to release impurities generated during the formation of the stealth laser-blast areas from the substrate through the release holes, which avoids low external quantum efficiency of LED due to adherence of the released material to the side wall of the stealth laser-blast areas.

In some embodiments, in step 2), the vertical extension line of the release holes facing the epitaxial layer is between adjacent LED units.

In some embodiments, in step 3), the release holes and the stealth laser-blast areas are at a same axis.

In some embodiments, the substrate is any one of a plain sapphire substrate, a patterned sapphire substrate, a Si substrate, a SiC substrate, a GaN substrate or a glass substrate.

In some embodiments, the substrate back surface has a reflective layer, and the reflective layer is a metal reflective layer, a distributed Bragg reflective layer or a multi-layer structure composed of a metal reflective layer and a distributed Bragg reflective layer.

In some embodiments, the metal reflective layer is an Al layer, an Ag layer or an Au layer.

Form a LED structure comprising a substrate according to the aforesaid cutting method, wherein, the structure has a plurality of release holes at the substrate back surface and stealth laser-blast areas inside, in which, the release holes and the stealth laser-blast areas are at a same axis and mutually communicative so that impurities generated during forming of the stealth laser-blast areas are released from the substrate through the release holes.

In some embodiments, the substrate is any one of a plain sapphire substrate, a patterned sapphire substrate, a Si substrate, a SiC substrate, a GaN substrate or a glass substrate.

In some embodiments, the vertical extension line of the release holes facing the epitaxial layer is between adjacent LED units.

According to the aforesaid backside scribing method during LED process, at first, form release holes at the substrate back surface with a plurality of LED units, and form stealth laser-blast areas by focusing a laser inside the substrate on positions corresponding to the release holes; communicate the release holes with the stealth laser-blast areas to release impurities generated during forming of the stealth laser-blast areas from the substrate through the release holes, which avoids low external quantum efficiency of the LED due to adherence of the released material to the side wall of the stealth laser-blast areas; also, compared with the prior art that only forms stealth laser-blast areas in the substrate, the present invention further eliminates abnormalities like inclined cracks of the non-cutting explosion point of the substrate that occur in subsequent splitting process and improves product yield by communicating the stealth laser-blast areas with the release holes at the substrate back surface.

The present disclosure further provides a GaN-based LED chip and fabrication method thereof. By giving full play of merits of the invisible laser cutting, it effectively removes by-products such as burn marks and debris after invisible laser cutting, and eliminates light absorption by such by-products, thus increasing light emitting at side wall of the LED and enhancing light extraction efficiency.

A fabrication method for the GaN-based LED chip, comprising: (1) providing a substrate; (2) forming an epitaxial layer on the substrate; (3) forming laser-burn holes inside the substrate through invisible laser cutting technology;

(4) fabricating P, N electrodes through photo mask and etching; (5) fabricating a LED chip through grinding and splitting process; wherein, in the invisible laser cutting technology of step (3), by focusing on a position with 10 µm~40 µm inward from the substrate back side, adjust laser energy to 0.32 W~0.6 W and frequency at 15 KHz~40 KHz to burn holes inside the substrate through invisible laser cutting that penetrate and expose the substrate back surface, thereby facilitating removal of by-products like burn marks and debris and reducing light absorption.

In some embodiments, the epitaxial layer comprises an N-GaN layer, a light-emitting layer and a P-GaN layer.

In some embodiments, the epitaxial layer is provided with cutting channels in network-like structure.

In some embodiments, the cutting channel is composed of a longitudinal cutting channel and a transverse cutting channel.

In some embodiments, burning positions inside the substrate at vertical direction from invisible laser cutting are consistent with the cutting channel positions from up to down.

In some embodiments, the holes are 1 μm~4 μm in spacing of 8 μm~20 μm.

In some embodiments, the substrate back surface is provided with a distributed Bragg reflective layer.

Compared with the prior art, innovative aspects of the present invention are that: By focusing at a position 10 μm~50 μm inward from the substrate back surface, increase laser energy and adjust laser frequency to burn holes inside the substrate through invisible laser cutting that penetrate and expose the substrate back surface, thereby facilitating removal of by-products like burn marks and debris and reducing light absorption. This increases light extraction at side wall of the LED and improves light extraction efficiency; also, as refractive indices of the substrate and holes are different, laser burning scratches equivalently roughen the LED chip side to increase light extraction angle, thus increasing axle light and overall light extraction efficiency of the LED chip; also, it effectively cuts manufacturing cost as by-products of invisible laser cutting are effectively removed without subsequent removal by chemical solutions.

BRIEF DESCRIPTION OF THE DRAWINGS

The accompanying drawings, which are included to provide a further understanding of the invention and constitute a part of this specification, together with the embodiments, are therefore to be considered in all respects as illustrative and not restrictive. In addition, the drawings are merely illustrative, which are not drawn to scale.

Figure 1:
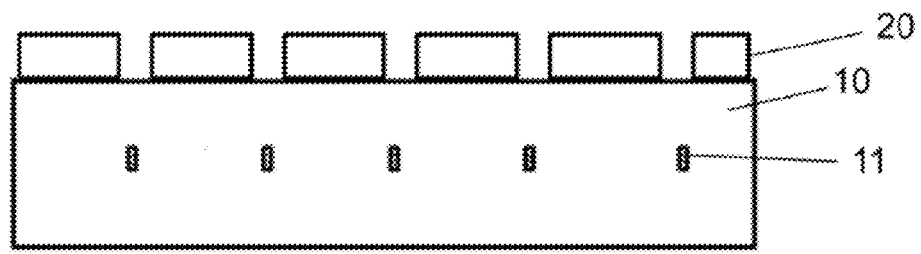
FIG. 1 is a side view of the LED wafer with formed stealth laser-blast areas of the prior art.

In the drawings: 10: substrate; 11: stealth laser-blast areas; 12: release holes; 20: epitaxial layer; 30: reflective layer; 31: release holes II; 101: patterned sapphire substrate; 102: N-GaN layer; 103: light-emitting layer; 104: P-GaN layer; 105: holes; 106: P electrode; 107: N electrode; 108: distributed Bragg reflective layer; A: transverse cutting channel; B: longitudinal cutting channel.

DETAILED DESCRIPTION

Various embodiments of the present disclosure will be described in detail with reference to the accompanying drawings and embodiments.

Embodiment 1

Figure 2:
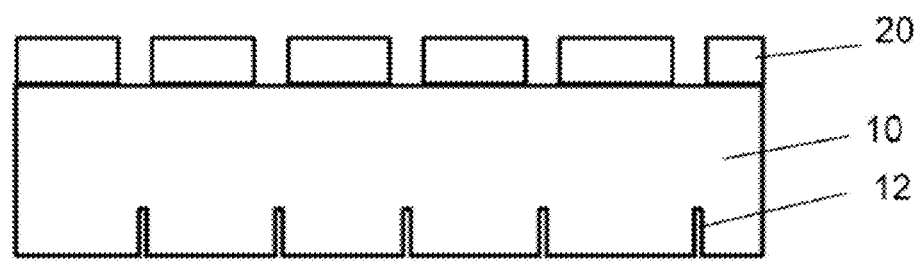
FIG. 2 is a schematic diagram of a first step of the backside scribing method according to Embodiment 1.
Figure 3:
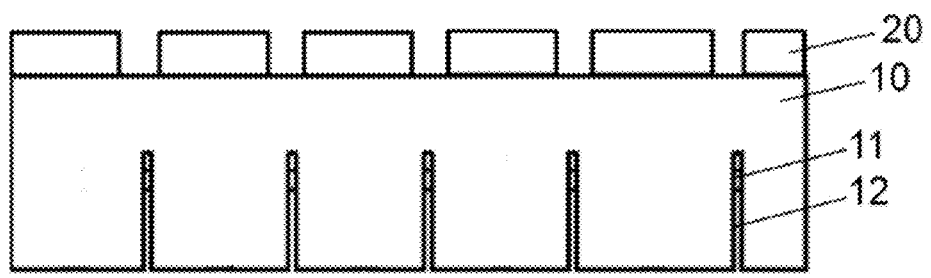
FIG. 3 is a schematic diagram of a second step of the backside scribing method according to Embodiment 1.
Figure 4:
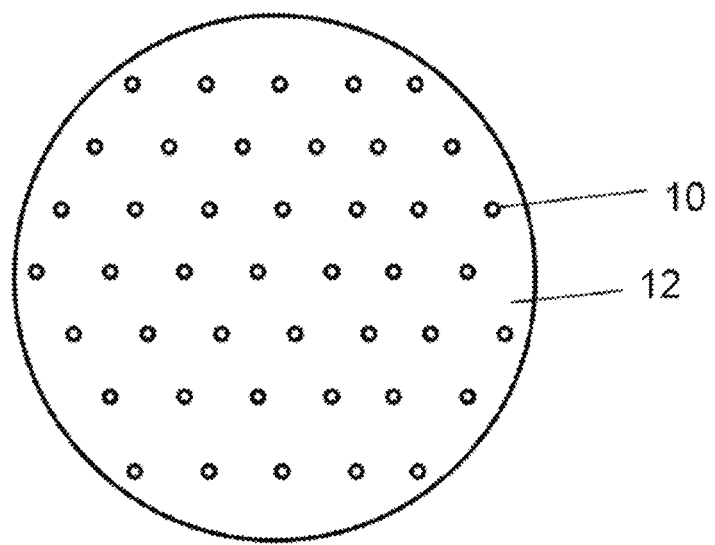
FIG. 4 is a back view of the substrate of Embodiment 1.

Referring to FIGS. 2-4, a backside scribing method during LED process is provided, comprising: providing a substrate 10, on which, grow an epitaxial layer and fabricate a plurality of LED units 20. The substrate 10 is any one of a plain sapphire substrate, a patterned sapphire substrate, a Si substrate, a SiC substrate, a GaN substrate or a glass substrate. During mass production of LED, a patterned sapphire substrate is preferred; forming a plurality of release holes 12 by focusing a laser at the back surface of the substrate 10; In some embodiments, pore size range of the release holes 12 is 1~6 μm, and the vertical extension line of the release holes 12 facing the epitaxial layer is between adjacent LED units 20; forming stealth laser-blast areas 11 by focusing a laser inside the substrate 10 on locations corresponding to the release holes 12; communicate the release holes 12 with the stealth laser-blast areas 11 to release the impurities generated during forming of the stealth laser-blast areas 11 from the substrate through the release holes 12, which avoids low external quantum efficiency of the LED due to adherence of the released material to the side wall of the stealth laser-blast areas 11; also, as the release holes 11 and the stealth laser-blast areas 12 are at a same axis, in subsequent splitting process of front side of the LED, a plurality of mutually-independent LEDs can be formed by splitting along the vertical line position where the stealth laser-blast areas 12 and the release holes 11 locate.

In the prior art, some technicians remove the burning impurities adhered to the side wall with blades or other tools, consuming massive manpower; moreover, such tools are likely to damage the surface of the LED epitaxial layer, resulting in poor LED quality and making it unfit for large-scale production. Instead, in the present invention, before formation of the stealth laser-blast areas 11, release holes 12 passing through the back surface of the substrate 10 and communicative with the stealth laser-blast areas 11 are formed at first to directly remove impurities generated from forming of the stealth laser-blast areas 11; with addition of forming release holes 12 during backside scribing, this method reduces the possibility of damaging the LED surfaces and saves human cost; meanwhile, compared with the prior art that only forms stealth laser-blast areas 11 in the substrate 10, the present invention further eliminates abnormalities like inclined cracks of the non-cutting explosion point of the substrate 10 that occur in subsequent splitting process and improves product yield by communicating the stealth laser-blast areas 11 and the release holes 12 at the substrate back surface.

Embodiment 2

Figure 5:
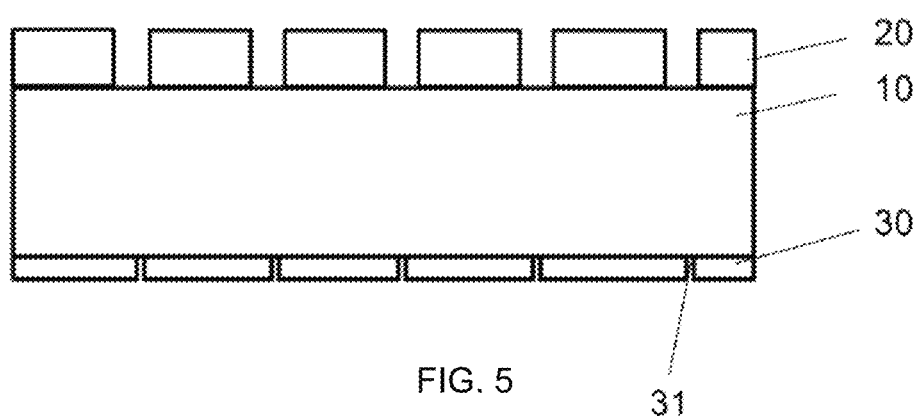
FIG. 5 is a schematic sectional diagram of a first step of the backside scribing method according to Embodiment 2.
Figure 6:
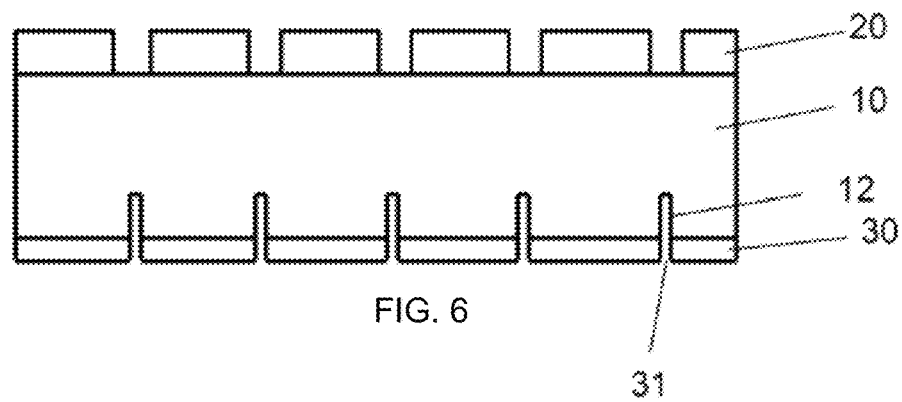
FIG. 6 is a schematic sectional diagram of a second step of the backside scribing method according to Embodiment 2.
Figure 7:
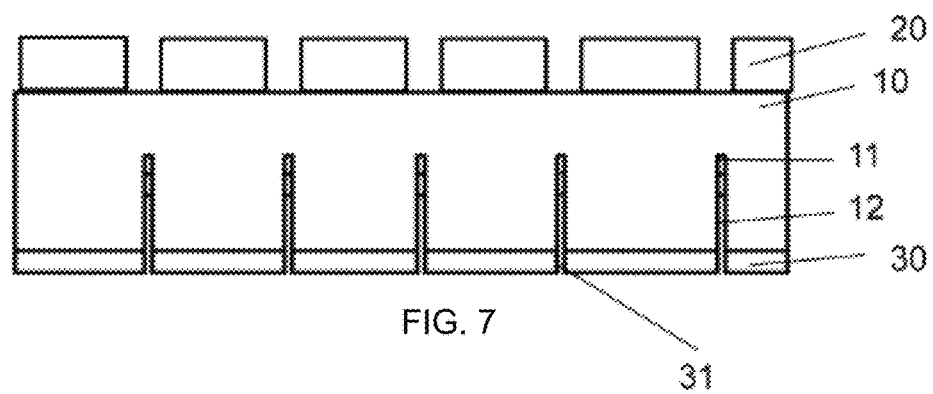
FIG. 7 is a schematic sectional diagram of a third step of the backside scribing method according to Embodiment 2.

Referring to FIGS. 5-7, the difference between this embodiment and Embodiment 1 is that: at first, deposit a reflective layer 30 at the back surface of the substrate 10, and remove the reflective layer 30 corresponding to gap of LED units 20 to form release holes II 31 inside the reflective layer 30; the reflective layer 30 is a metal reflective layer, a distributed Bragg reflective layer or a multi-layer structure composed of a metal reflective layer and a distributed Bragg reflective layer, wherein, the metal reflective layer is an Al layer, an Ag layer or an Au layer. In this embodiment, a distributed Bragg reflective layer with high reflectivity is preferred; then, form release holes 12 by focusing a laser on the surface of the substrate 10 at corresponding positions of the release holes II 31 and form stealth laser-blast areas 11 via invisible laser cutting; in subsequent splitting process of front side of the LED, a plurality of mutually-independent LED units 20 can be formed by splitting along the vertical line position where the release holes II 31, the release holes 12 and the stealth laser-blast areas 11 locate.

Embodiment 3

Figure 8:
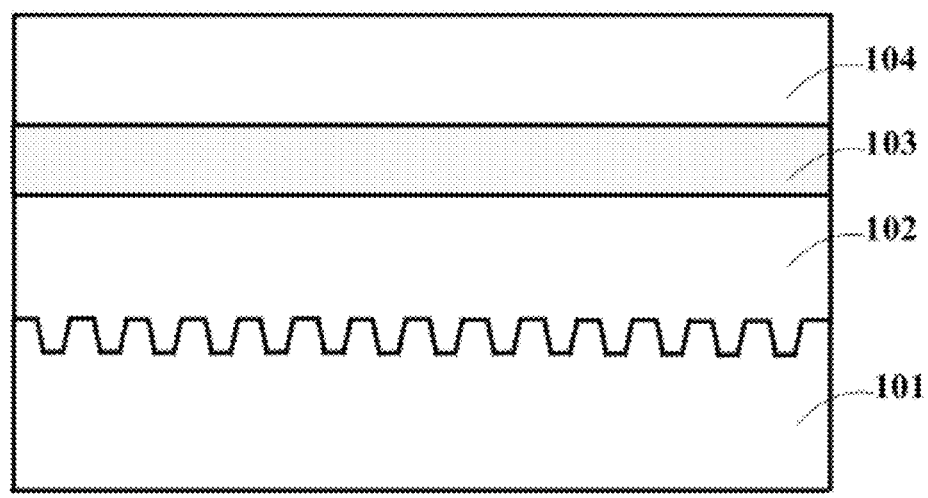
FIG. 8 is a schematic sectional diagram of a first step of the fabrication process for the GaN-based LED chip according to Embodiment 3.

This embodiment provides a fabrication method for GaN LED chip, comprising steps below:

As shown in FIG. 8, on the patterned sapphire substrate 101, epitaxially grow an N-GaN layer 102, a light-emitting layer 103 and a P-GaN layer 104 in sequence via metal-organic chemical vapor deposition (MOCVD).

Figure 9:
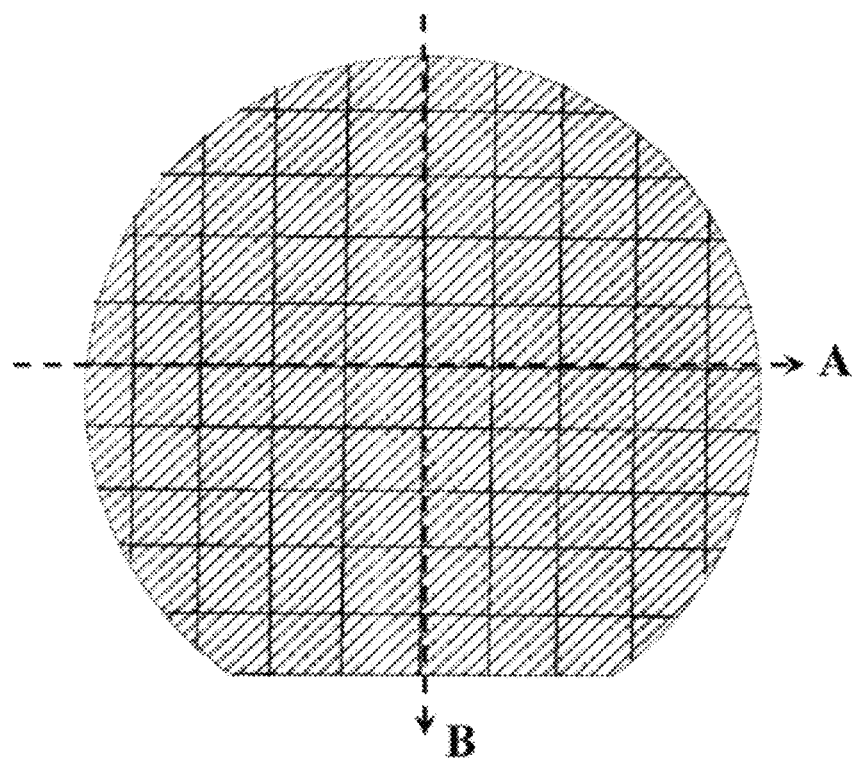
FIG. 9 is a schematic sectional diagram of a second step of the fabrication process for the GaN-based LED chip according to Embodiment 3.

As shown in FIG. 9, take laser scribing along the epitaxial layer surface to form a longitudinal cutting channel B at the direction vertical to the plain edge, and form a transverse cutting channel A at the direction parallel to the plain edge, wherein, cutting channels A and B form a network-like structure.

Figure 10:
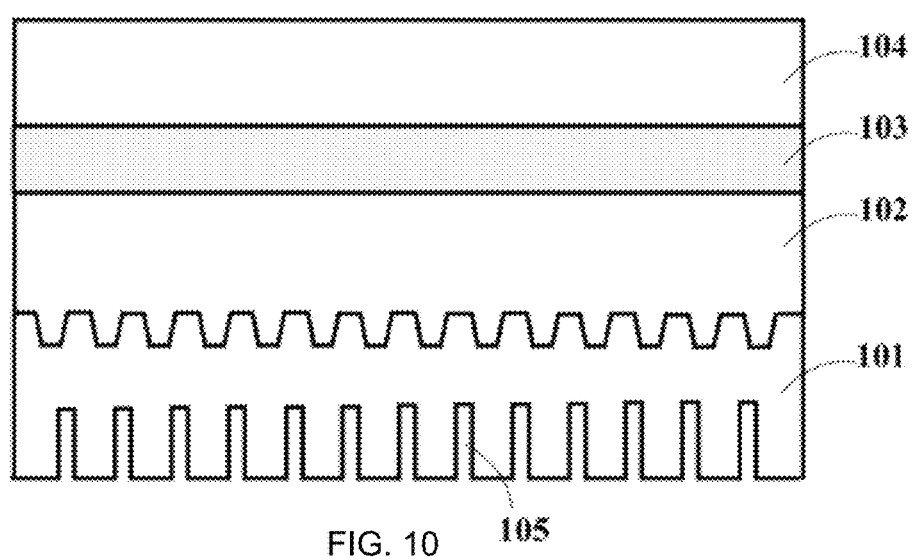
FIG. 10 is a schematic sectional diagram of a third step of the fabrication process for the GaN-based LED chip according to Embodiment 3.

As shown in FIG. 10, focus a laser at a position 10 μm~40 μm inward from the substrate back surface; increase laser energy to 0.32 W~0.6 W and adjust laser frequency at 15 KHz~40 KHz; make burning positions inside the substrate at vertical direction from invisible laser cutting consistent with the cutting channel positions from up to down; burn the holes 105 inside the substrate via invisible laser cutting that pass through and expose the substrate back surface, thereby effectively removing by-products like burn marks and debris and reducing light absorption; in this embodiment, the laser-burn holes 105 are sized 1 μm~4 μm at a spacing of 8 μm~20 μm; as refractive indices of the substrate 101 and laser-burn holes 105 are different, laser burning scratches equivalently roughen the LED chip side to increase light extraction angle, thus increasing axle light and overall light extraction efficiency of the LED chip; also, it effectively cuts manufacturing cost as by-products of invisible laser cutting are effectively removed without subsequent removal by chemical solutions.

Figure 11:
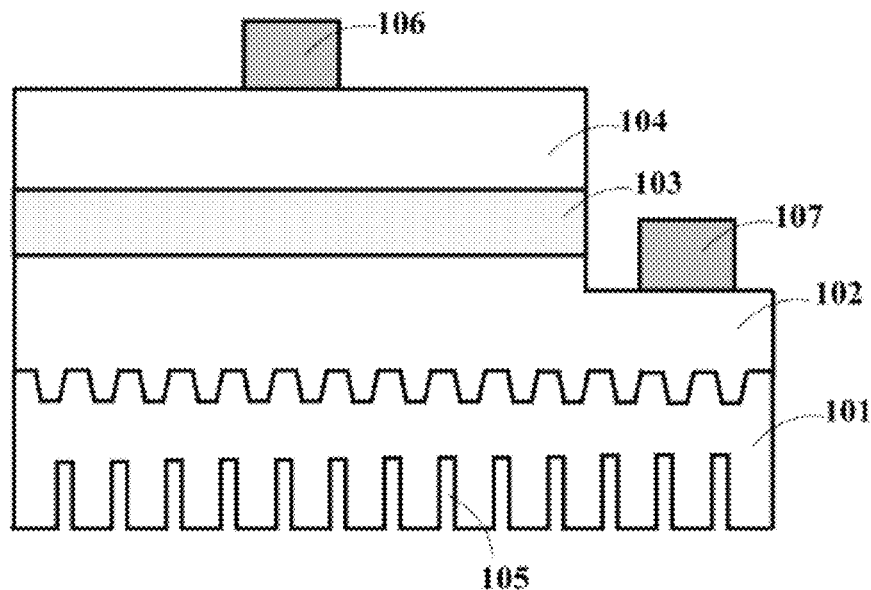
FIG. 11 is a schematic sectional diagram of a fourth step of the fabrication process for the GaN-based LED chip according to Embodiment 3.

As shown in FIG. 11, fabricate a P electrode 106 on the P-GaN layer 104 and an N electrode 107 on the exposed N-GaN layer 102 through photo mask and etching; and fabricate a LED chip through grinding and splitting process.

The GaN-based LED chip fabricated according to this embodiment features high luminous efficiency and good quality compared with chips fabricated from conventional process.

Embodiment 4

Figure 12:
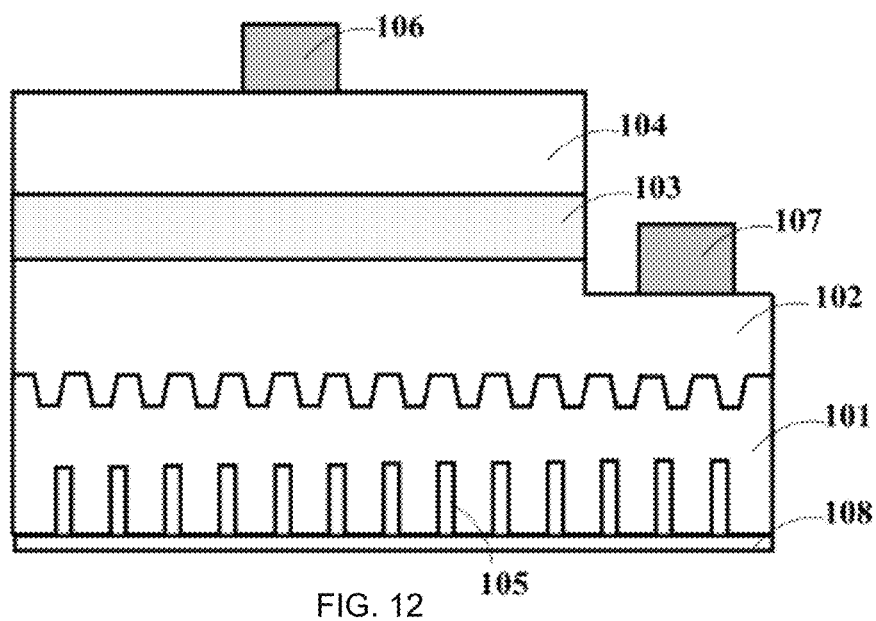
FIG. 12 is a structural schematic diagram of the GaN-based LED chip of Embodiment 4.

As shown in FIG. 12, different from Embodiment 3, the substrate back surface of this embodiment has a distributed Bragg reflective layer 108 to further improve light extraction efficiency of the LED chip. It should be noted that the distributed Bragg reflective layer 108 can be fabricated either before invisible laser cutting inside the substrate or after formation of laser-burn holes inside the substrate via invisible laser cutting.

All references referred to in the present disclosure are incorporated by reference in their entirety. Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A method for fabricating a light emitting diode (LED), comprising:
   1) growing an epitaxial layer and fabricating a plurality of LED units over a substrate;
   2) forming a plurality of release holes by focusing a laser at a back surface of the substrate;
   3) forming stealth laser-blast areas by focusing a laser inside the substrate at positions corresponding to and communicative with the release holes after said forming a plurality of release holes; releasing materials generated during the forming of the stealth laser-blast areas from the substrate through the release holes, thereby improving external quantum efficiency of the LED by avoiding adherence of the released material to side walls of the stealth laser blast areas.

2. The method of claim 1, wherein in step 2), vertical extension lines of the release holes facing the epitaxial layer are between adjacent LED units.

3. The method of claim 1, wherein in step 3), the release holes and the stealth laser-blast areas are along respective same axes.

4. The method of claim 1, wherein the substrate comprises at least one of a plain sapphire substrate, a patterned sapphire substrate, a Si substrate, a SiC substrate, a GaN substrate, or a glass substrate.

5. The method of claim 1, wherein the substrate back surface has a reflective layer comprising at least one of a metal reflective layer, a distributed Bragg reflective layer, or a multi-layer structure including a metal reflective layer and a distributed Bragg reflective layer.

6. The method of claim 5, wherein the metal reflective layer comprises at least one of an Al layer, an Ag layer, or an Au layer.

7. The method of claim 1, wherein said forming a plurality of release holes comprises forming a plurality of release holes for each of the plurality of LED units.

8. A light emitting diode (LED) comprising a substrate, wherein: the LED has a structure fabricated with a method comprising:
   1) growing an epitaxial layer and fabricating a plurality of LED units over a substrate;

2) forming a plurality of release holes by focusing a laser at a back surface of the substrate;
3) forming stealth laser-blast areas by focusing a laser inside the substrate at positions corresponding to and communicative with the release holes after said forming a plurality of release holes; releasing materials generated during the forming of the stealth laser-blast areas from the substrate through the release holes, to thereby improving external quantum efficiency of the LED by avoiding adherence of the released material to side walls of the stealth laser blast areas.

9. The LED of claim 8, wherein the structure has a plurality of release holes at the substrate back surface and stealth laser-blast areas inside the substrate, in which, the release holes and the stealth laser blast areas are along respective same axes and mutually communicative such that materials generated during forming of the stealth laser blast areas are released from the substrate through the release holes.

10. The LED of claim 8, wherein the substrate comprises at least one of a plain sapphire substrate, a patterned sapphire substrate, a Si substrate, a SiC substrate, a GaN substrate, or a glass substrate.

11. The LED of claim 8, wherein vertical extension lines of the stealth laser-blast areas facing the epitaxial layer are between adjacent LED units.

12. The LED of claim 8, wherein each of the plurality of LED units corresponds to a plurality of release holes and their respectively-associated stealth laser-blast areas.

13. A method for fabricating a light emitting diode (LED), comprising:
(1) providing a substrate;
(2) forming an epitaxial laminated layer over the substrate; and cutting channels over the epitaxial laminated layer;
(3) forming laser-burn holes inside the substrate through stealth laser cutting after said cutting channels;
(4) fabricating P and N electrodes through photo mask and etching;
(5) fabricating an LED chip through grinding and splitting processes;
wherein: in the stealth laser cutting of step (3), by focusing on positions with a range of approximately 10 µm to 40 µm inward from a back surface of the substrate, and adjusting laser energy to a range of approximately 0.32 W to 0.6 W and frequency at a range of approximately 15 KHz to 40 KHz to form the laser-burn holes inside the substrate through the stealth laser cutting that penetrate the substrate back surface, thereby facilitating removal of by-products including burn marks and debris and reducing light absorption.

14. The method of claim 13, wherein the epitaxial laminated layer comprises an N-GaN layer, a light-emitting layer, and a P-GaN layer.

15. The method of claim 13, wherein the epitaxial laminated layer is provided with the channels in a network-like structure.

16. The method of claim 15, wherein the channels comprise a longitudinal cutting channel and a transverse cutting channel.

17. The method of claim 15, wherein burn positions inside the substrate at vertical direction from the stealth laser cutting are consistent with the cutting channel positions from up to down.

18. The method of claim 13, wherein spacing of the laser-burn holes is in a range of approximately 8 µm to 20 µm.

19. The method of claim 13, wherein the laser-burn holes have sizes of approximately 1 µm to 4 µm.

20. The method of claim 13, wherein the substrate back surface is provided with a distributed Bragg reflective layer.

* * * * *